United States Patent
Tsugeno et al.

(10) Patent No.: US 9,537,026 B2
(45) Date of Patent: Jan. 3, 2017

(54) METHOD FOR MANUFACTURING SOLAR-POWER-GENERATOR SUBSTRATE AND APPARATUS FOR MANUFACTURING SOLAR-POWER-GENERATOR SUBSTRATE

(71) Applicant: MITSUBISHI ELECTRIC CORPORATION, Chiyoda-ku, Tokyo (JP)

(72) Inventors: Hajime Tsugeno, Tokyo (JP); Mitsuhiro Nonogaki, Tokyo (JP); Junji Kobayashi, Tokyo (JP); Yusuke Oshiro, Tokyo (JP); Takahiro Kawasaki, Tokyo (JP); Shoichi Karakida, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/890,309

(22) PCT Filed: Jun. 12, 2014

(86) PCT No.: PCT/JP2014/065648
§ 371 (c)(1),
(2) Date: Nov. 10, 2015

(87) PCT Pub. No.: WO2014/208353
PCT Pub. Date: Dec. 31, 2014

(65) Prior Publication Data
US 2016/0118512 A1    Apr. 28, 2016

(30) Foreign Application Priority Data
Jun. 24, 2013   (JP) .................................. 2013-131584

(51) Int. Cl.
*H01L 21/331*   (2006.01)
*H01L 21/8222*  (2006.01)
(Continued)

(52) U.S. Cl.
CPC ......... *H01L 31/02363* (2013.01); *H01L 31/18* (2013.01); *H01L 31/1804* (2013.01); *Y02E 10/547* (2013.01); *Y02P 70/521* (2015.11)

(58) Field of Classification Search
CPC ........... H01L 21/02252; H01L 21/0455; H01L 21/1203; H01L 21/31138; H01L 21/3226; H01L 21/67069; H01L 21/67075; H01L 21/7624; H01L 31/18; H01L 31/095; C23C 16/456; Y02E 10/547
(Continued)

(56) References Cited

U.S. PATENT DOCUMENTS 6,131,588 A    10/2000   Kamikawa et al.
6,319,329 B1   11/2001   Kamikawa et al.
(Continued)

FOREIGN PATENT DOCUMENTS

CN    1882714 B     6/2010
CN    101818378 B   11/2011
(Continued)

OTHER PUBLICATIONS

International Search Report (PCT/ISA/210) mailed on Aug. 26, 2014, by the Japanese Patent Office as the International Searching Authority for International Application No. PCT/JP2014/065648.
(Continued)

*Primary Examiner* — David Nhu
(74) *Attorney, Agent, or Firm* — Buchanan Ingersoll & Rooney PC

(57) ABSTRACT

A method for manufacturing a solar-power-generator substrate by cutting out a semiconductor substrate by slicing a
(Continued)

semiconductor ingot and then by forming a texture structure on a surface of the semiconductor substrate by performing a surface treatment on the surface of the semiconductor substrate, includes: cleaning including cleaning and removing an organic impurity and a metal impurity adhering to the surface of the semiconductor substrate with a cleaning fluid containing an oxidizing chemical; and etching including removing a damaged layer on a substrate surface generated by the slicing and forming the texture structure on the surface of the semiconductor substrate by performing anisotropic etching on the surface of the semiconductor substrate with an alkaline aqueous solution, the etching being performed subsequent to the cleaning.

12 Claims, 5 Drawing Sheets

(51) Int. Cl.
    *H01L 31/0236* (2006.01)
    *H01L 31/18* (2006.01)
(58) Field of Classification Search
    USPC ............ 438/311, 680, 706, 745, 753, 793;
    257/E21.006, E21.007, E21.077, E21.123,
    257/E21.158, E21.17, E21.229, E21.237,
    257/E21.246, E21.32
    See application file for complete search history.

(56) References Cited

U.S. PATENT DOCUMENTS

| | | | | |
|---|---|---|---|---|
| 6,323,415 | B1* | 11/2001 | Uematsu | ............ B32B 17/10018 |
| | | | | 136/246 |
| 6,489,704 | B1* | 12/2002 | Kucherov | ............ H01J 45/00 |
| | | | | 310/306 |
| 6,670,544 | B2* | 12/2003 | Kibbel | ............ H01L 31/0352 |
| | | | | 136/249 |
| 7,148,417 | B1* | 12/2006 | Landis | ............ H01L 31/0725 |
| | | | | 136/262 |
| 8,921,683 | B2* | 12/2014 | Hu | ............ H01L 35/30 |
| | | | | 136/200 |
| 2002/0017315 | A1 | 2/2002 | Kamikawa et al. | |
| 2005/0016958 | A1 | 1/2005 | Tan et al. | |
| 2005/0167393 | A1 | 8/2005 | Tan et al. | |

FOREIGN PATENT DOCUMENTS

| | | |
|---|---|---|
| JP | H05-152274 A | 6/1993 |
| JP | 11-044443 A | 2/1999 |
| JP | 2006-319170 A | 11/2006 |
| JP | 2012-009722 A | 1/2012 |
| JP | 4989042 B2 | 8/2012 |
| JP | 2013-110327 A | 6/2013 |
| KR | 10-0385037 B1 | 8/2003 |
| TW | 201205653 A | 2/2012 |

OTHER PUBLICATIONS

Written Opinion (PCT/ISA/237) mailed on Aug. 26, 2014, by the Japanese Patent Office as the International Searching Authority for International Application No. PCT/JP2014/065648.

Office Action issued on Mar. 25, 2016, by the Taiwanese Patent Office in corresponding Taiwanese Patent Application No. 103121513 and English translation of the Office Action. (10 pages).

Office Action (Notice of Rejection) issued on Jun. 21, 2016, by the Japanese Patent Office in corresponding Japanese Patent Application No. 2015-523974, and a Partial English Translation of the Office Action. (6 pages).

Office Action (Notification of the First Office Action) issued on Jul. 5, 2016, by the Chinese Patent Office in corresponding Chinese Patent Application No. 201480035248.X, and an English Translation of the Office Action. (12 pages).

Office Action (Notice of Preliminary Rejection) issued on Jul. 6, 2016, by the Korean Patent Office in corresponding Korean Patent Application No. 10-2015-7035579, and an English Translation of the Office Action. (8 pages).

* cited by examiner

METHOD FOR MANUFACTURING SOLAR-POWER-GENERATOR SUBSTRATE AND APPARATUS FOR MANUFACTURING SOLAR-POWER-GENERATOR SUBSTRATE

FIELD

The present invention relates to a method for manufacturing a solar-power-generator substrate and an apparatus for manufacturing a solar-power-generator substrate.

BACKGROUND

There has been a demand to improve the power-generation efficiency of solar power generators that will lead to a reduction in manufacturing costs. One method of improving the power-generation efficiency is to form an uneven structure on the surface of a silicon substrate of the solar power generator that allows the silicon substrate to efficiently absorb more sunlight. This uneven structure referred to as "texture" is a collective term for microasperities formed on the surface of the silicon substrate. An uneven structure, for example, is known that has convex portions in the form of quadrangular pyramids each surrounded by silicon (111) surfaces. With this texture, it is possible to allow repeated reflections a plurality of times in such a manner that sunlight once reflected by the surface of the texture reaches the surface of the texture again, thereby allowing absorption of more sunlight (an optical confinement effect).

During the manufacturing of the solar power generator, the texture is usually formed on the surface of the silicon substrate by immersing the silicon substrate in a high-temperature chemical solution (a wet etchant) obtained by adding, as an additive, organic matter such as IPA to an alkaline aqueous solution such as sodium hydroxide or potassium hydroxide and then by using the property that the etching rate is different depending on the surface orientation of silicon.

In order to improve the quality of the solar power generator, various manufacturing processes performed between a step of slicing and processing a silicon ingot into a substrate and a step of forming the texture structure on the surface of the substrate have been proposed.

When the substrate is sliced, chips and abrasive generated by the scraping of the wire adhere to the substrate. Such chips and the abrasive are cleaned and removed after the slicing. Further, processing strain caused by the slicing, referred to as a "damaged layer", is generated on the surface layer of the sliced substrate up to a depth of about 5 μm. When the damaged layer remains in the solar power generator, recombination of electrons is accelerated in the damaged layer, causing degradation of the characteristics of the solar power generator. Therefore, it is generally necessary to perform a step of removing the damaged layer.

For removing the damaged layer, a step is required in which the substrate surface is etched by using, for example, an alkali solution or a mixed solution of hydrofluoric acid and nitric acid to scrape the substrate surface. By performing such a step of removing the damaged layer, organic impurities and metal impurities that are contaminants remaining on the substrate surface are removed at the same time as the separation of a natural oxide film.

However, when a silicon active surface is exposed as a result of the removal of the damaged layer, organic impurities and metal impurities hindering formation of the texture easily adhere to the surface of the substrate, and therefore such a substrate cannot be placed in the air for a long time.

As a method for preventing adhesion of impurities to the substrate even if the substrate is left in the air for a long time after the removal of the damaged layer, for example, a method is proposed in Patent Literature 1 in which a substrate from which a damaged layer has been removed is immersed in an oxidizing chemical solution to form a chemical oxide film on the substrate surface.

With Patent Literature 1, adhesion of organic impurities and metal impurities that are contaminants can be suppressed by forming a chemical oxide film on the active silicon substrate surface from which the damaged layer has been removed and thereby protecting the active silicon substrate surface. It is also disclosed that, because it is possible to leave the silicon substrate after removal of the damaged layer in the air for a long time, the process can be performed without taking care of the storage for the texture formation at the next step.

In this case, however, a device for removing the damaged layer and a device for forming the texture are required. That is, at least two processing devices are required. Further, a drying process and the like have to be performed during each of the treatments performed by the respective devices, making the process redundant.

In addition, Patent Literature 1 discloses that, although organic impurities and metal impurities also adhere to the oxidation film formed on the surface of the silicon substrate from the air, they are removed together with the oxidation film at the texture formation step, which is the next step, and therefore cause no problem.

However, organic impurities and metal impurities adhering to the oxidation film formed on the surface of the silicon substrate remain in the alkaline aqueous solution together with the oxidation film during wet etching that is performed to form the texture using an alkaline aqueous solution (an etchant). After the etching treatment, the alkali and the additive that have been consumed in a single etching treatment are compensated for, so that the etchant is used a plurality of times. Therefore, the organic impurities and the metal impurities separated from the silicon substrate are accumulated in the etchant and cause degradation of the performance of the etchant. Accordingly, there is a problem in that it becomes necessary to shorten the replacement period of the etchant and this leads to an increase in the chemical solution costs.

CITATION LIST

Patent Literature

Patent Literature 1: Japanese Patent No. 4989042

SUMMARY

Technical Problem

The present invention has been achieved to solve the above problems, and an object of the present invention is to provide a method for manufacturing a solar-power-generator substrate and an apparatus for manufacturing a solar-power-generator substrate that can form a texture structure on the surface of a semiconductor substrate uniformly and at low cost so as to allow a high-quality solar-power-generator substrate having a low light reflectance on its surface to be manufactured at low cost.

Solution to Problem

In order to solve the above problems and achieve the object, a method for manufacturing a solar-power-generator substrate according to an aspect of the present invention is a method for manufacturing a solar-power-generator substrate by cutting out a semiconductor substrate by slicing a semiconductor ingot and then by forming a texture structure on a surface of the semiconductor substrate by performing a surface treatment on the surface of the semiconductor substrate, the method including: a cleaning step of cleaning and removing an organic impurity and a metal impurity adhering to the surface of the semiconductor substrate with a cleaning fluid containing an oxidizing chemical; and an etching step of removing a damaged layer on a substrate surface generated by the slicing and forming the texture structure on the surface of the semiconductor substrate by performing anisotropic etching on the surface of the semiconductor substrate with an alkaline aqueous solution, the etching step being performed subsequent to the cleaning step.

Advantageous Effects of Invention

According to the present invention, an effect is obtained where a texture structure can be formed on the surface of a semiconductor substrate uniformly and at low cost so as to allow a high-quality solar-power-generator substrate having a low light reflectance on its surface to be manufactured at low cost.

DESCRIPTION OF EMBODIMENTS

Figure 1:
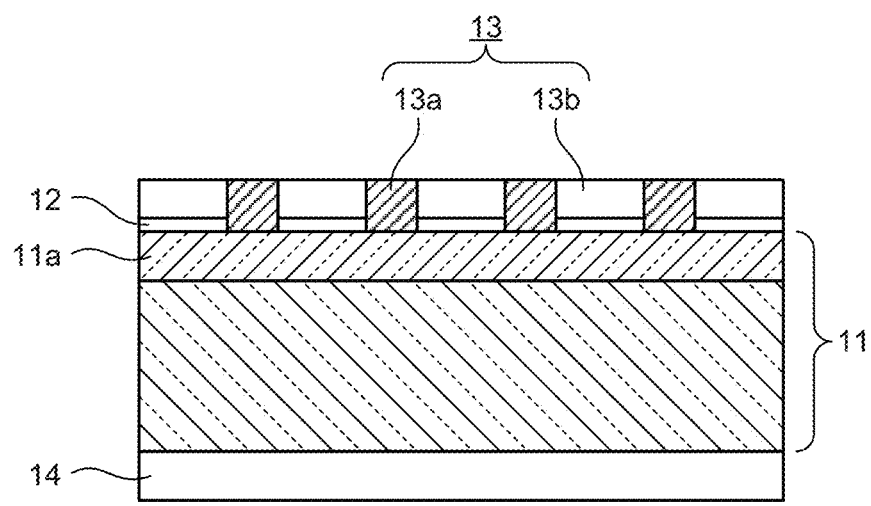
FIG. 1 is a cross-sectional view of the relevant parts of a solar power generator manufactured by using a solar-power-generator substrate formed by a method for manufacturing a solar-power-generator substrate according to an embodiment of the present invention.

Exemplary embodiments of a method for manufacturing a solar-power-generator substrate and an apparatus for manufacturing a solar-power-generator substrate according to the present invention will be explained below in detail with reference to the accompanying drawings. The present invention is not limited to the following descriptions and can be modified as appropriate without departing from the scope of the invention. In the drawings explained below, for easier understanding, scales of respective members may be shown differently from those of actual products. This holds true for the relationships between the drawings.

Embodiment

An embodiment relates to cleaning of organic impurities and metal impurities that are contaminants adhering to the surface of a silicon substrate including single-crystal silicon and hindering formation of a texture on the surface of the silicon substrate, and relates to formation of a texture on the surface of a silicon substrate by wet etching.

Figure 2:
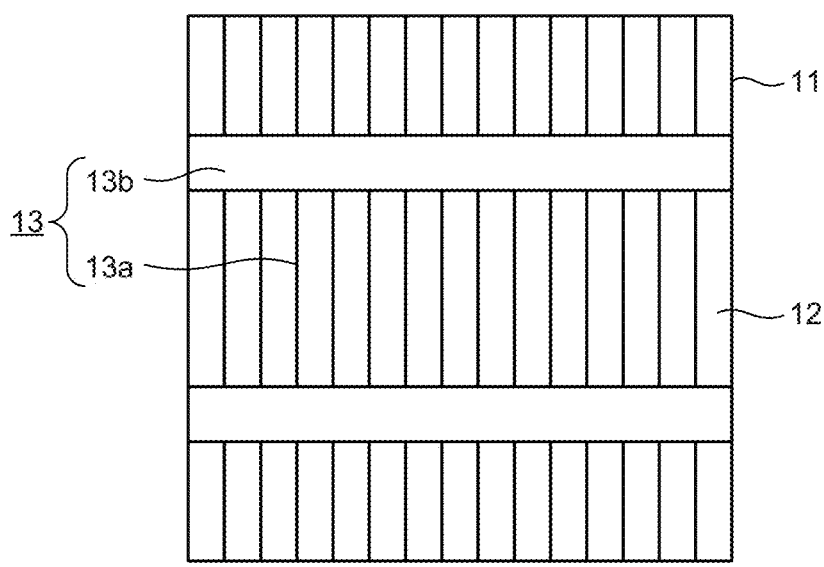
FIG. 2 is a top view of the solar power generator manufactured by using the solar-power-generator substrate formed by the method for manufacturing the solar-power-generator substrate according to the embodiment of the present invention.

First, a solar power generator is described that is manufactured by a method for manufacturing a solar-power-generator substrate according to the present embodiment. FIGS. 1 and 2 are diagrams illustrating a solar power generator manufactured by using a solar-power-generator substrate formed by the method for manufacturing the solar-power-generator substrate according to the present embodiment. FIG. 1 is a cross-sectional view of the relevant parts of the solar power generator, and FIG. 2 is a top view of the solar power generator. The solar power generator illustrated in FIGS. 1 and 2 includes a single-crystal silicon substrate 11 having an N-type impurity diffusion layer 11a in a surface layer of a P-type single-crystal silicon substrate; an anti-reflective film 12 formed on the surface (the front surface) of the single-crystal silicon substrate 11 on the light-receiving surface side; a light-receiving-surface side electrode 13 formed on the surface (the front surface) of the single-crystal silicon substrate 11 on the light-receiving surface side; and a back-surface electrode 14 formed on the surface (the back surface) of the single-crystal silicon substrate 11 on the opposite side of the light-receiving surface. The light-receiving-surface side electrode 13 is formed such that it is surrounded by the anti-reflective film 12 in the plane direction of the single-crystal silicon substrate 11.

The light-receiving-surface side electrode 13 includes grid electrodes 13a and bus electrodes 13b. FIG. 1 illustrates a cross-sectional view of a cross section perpendicular to the longitudinal direction of the grid electrodes 13a. The solar power generator is formed by using, as the single-crystal silicon substrate 11, a single-crystal silicon substrate on the surface of which a texture structure is formed by the method for manufacturing the solar-power-generator substrate according to the present embodiment.

Next, processes for manufacturing the solar power generator illustrated in FIGS. 1 and 2 are described. The processes described here are the same as those for manufacturing a general solar power generator using a silicon substrate, and thus these processes are not particularly illustrated in the drawings.

First, a P-type single-crystal silicon substrate is cut out from a silicon ingot by slicing the silicon ingot. The surface of the P-type single-crystal silicon substrate cut out from the silicon ingot by the slicing has organic impurities and metal impurities adhering thereto. The organic impurities and the metal impurities are contaminants formed of chips, abrasive or the like generated by the scraping of the wire during the slicing. Therefore, the P-type single-crystal silicon substrate cut out from the silicon ingot is subjected to a cleaning treatment such as a washing treatment. However, these contaminants cannot be completely removed and remain on the surface of the P-type single-crystal silicon substrate after the cleaning. Thus, cleaning to remove those contaminants adhering to the surface of the P-type single-crystal silicon substrate is required.

Further, the processing strain caused by the slicing, referred to as a "damaged layer", is generated on the surface layer of the sliced substrate up to a depth of about 5 μm. When this damaged layer remains in the solar power generator, recombination of electrons is accelerated in the damaged layer, causing degradation of the characteristics of the solar power generator. Therefore, it is necessary to remove the damaged layer.

In addition, the texture structure, formed by asperities having convex portions in the form of quadrangular pyramids each surrounded by silicon (111) surfaces, for example, is formed on the surface of the P-type single-crystal silicon substrate by anisotropic etching using a high-temperature chemical solution (a wet etchant) obtained by adding, as an additive, organic matter such as IPA to an alkaline aqueous solution, in order to allow the solar power generator to absorb more sunlight.

Therefore, cleaning to remove contaminants adhering to the surface of the P-type single-crystal silicon substrate, removal of the damaged layer, and formation of the texture structure described above are performed also in the present embodiment. These treatments are described later.

Next, the P-type single-crystal silicon substrate having the texture formed on the surface thereof is put into a thermal oxidation furnace and is heated in the presence of vapor of phosphorus oxychloride ($POCl_3$) to form phosphorus glass on the surface of the P-type single-crystal silicon substrate, so that phosphorus is diffused in the P-type single-crystal silicon substrate. In this manner, the N-type impurity diffusion layer 11a is formed in the surface layer of the P-type single-crystal silicon substrate, and thus the single-crystal silicon substrate 11 is formed.

Subsequently, the phosphorus glass layer on the surface of the single-crystal silicon substrate 11 is removed with a hydrofluoric acid solution, and thereafter a silicon nitride film (SiN film) is formed as the anti-reflective film 12 on the N-type impurity diffusion layer 11a by using a plasma CVD method. The thickness and the refractive index of the anti-reflective film 12 are set to values in such a manner that there is maximum suppression of the light reflection. Two or more films having different refractive indexes may be stacked one on the other. Further, the anti-reflective film 12 may be formed by a different deposition method such as sputtering.

Paste with silver mixed therein is then screen-printed on the light-receiving surface of the single-crystal silicon substrate 11 in a comb-like shape, and paste with aluminum mixed therein is screen-printed over the entire back surface of the single-crystal silicon substrate 11. The printed pastes are then baked, so that the light-receiving-surface side electrode 13 and the back-surface electrode 14 are formed. In such a manner, the solar power generator illustrated in FIGS. 1 and 2 is manufactured as a solar power generator.

In the solar power generator manufactured in the above manner, organic impurities and metal impurities usually adhere to the surface of the P-type single-crystal silicon substrate before the texture structure is formed. These organic impurities and metal impurities are contaminants that cannot be completely removed by cleaning after the slicing and remain, causing a failure to form the texture. In a case where a P-type single-crystal silicon substrate from which these contaminants are completely removed is used and the texture is formed on the surface thereof, quadrangular pyramids, each of which is surrounded by silicon (111) surfaces and has a bottom with a side length of about 1 μm to 10 μm, are uniformly and densely formed over the entire region within the surface of the P-type single-crystal silicon substrate, as illustrated in FIG. 3.

Figure 3:
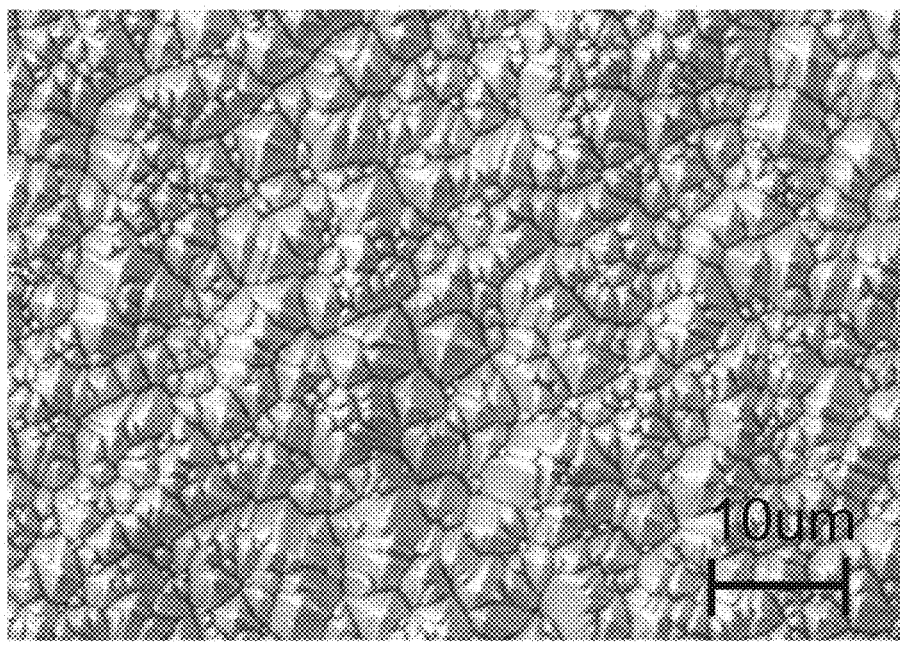
FIG. 3 is a diagram illustrating an electron microscope photograph of an etched surface in a case where a silicon substrate is cleaned before the texture is formed and the texture is satisfactorily formed.

FIG. 3 is a diagram illustrating an electron microscope photograph of an etched surface in a case where a silicon substrate is cleaned before the texture is formed and the texture is satisfactorily formed. In the example illustrated in FIG. 3, the texture structure is formed by immersing a P-type single-crystal silicon substrate in an alkaline aqueous solution heated to 85° C. for 20 minutes. The alkaline aqueous solution is obtained by mixing 0.75 wt % sodium hydroxide and 2.0 vol % organic matter referred to as an "additive", such as IPA, for controlling the etching rate depending on the surface orientation of silicon.

Figure 4:
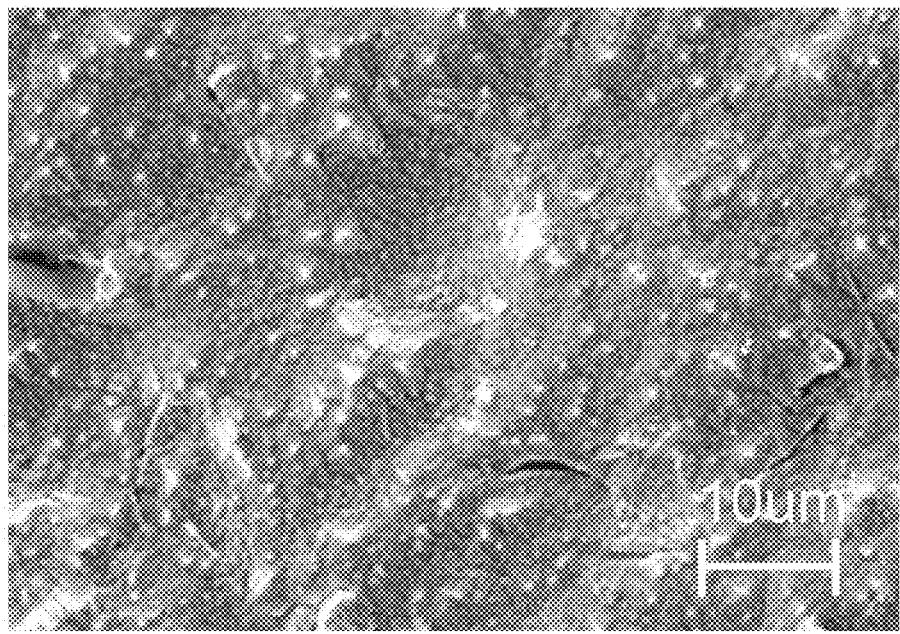
FIG. 4 is a diagram illustrating an electron microscope photograph of an etched surface in a case where a silicon substrate is not cleaned before the texture is formed and a failure to form the texture has occurred.

However, in a case where contaminants (organic impurities and metal impurities) causing a failure to form the texture remain on the surface of the P-type single-crystal silicon substrate as described above, a region where no quadrangular pyramid surrounded by silicon (111) surfaces is formed is generated within the surface of the P-type single-crystal silicon substrate, as illustrated in FIG. 4, for example. FIG. 4 is a diagram illustrating an electron microscope photograph of an etched surface in a case where a silicon substrate is not cleaned before the texture is formed and a failure to form the texture has occurred. When the texture is not formed on the surface of the P-type single-crystal silicon substrate normally, i.e., the texture is not formed uniformly and densely as described above, degradation of the characteristics of the solar power generator and a problem in terms of the appearance thereof may be caused. Therefore, it is necessary to remove these contaminants.

Figure 5:
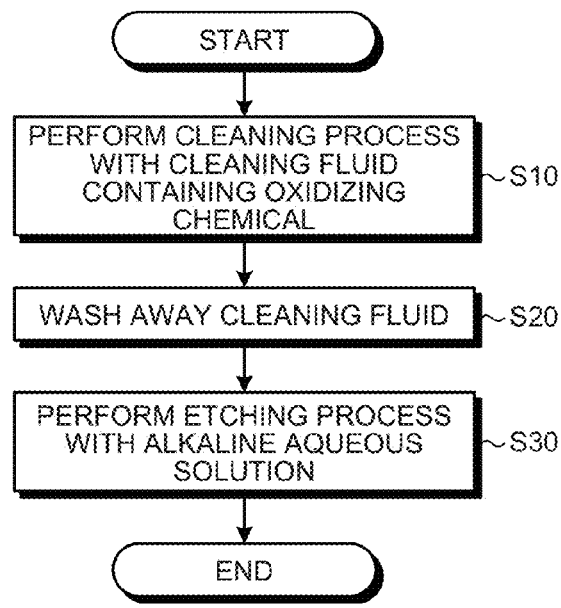
FIG. 5 is a flowchart explaining the flow of the method for manufacturing the solar-power-generator substrate according to the embodiment of the present invention.

Accordingly, in the present embodiment, a treatment illustrated in FIG. 5 is performed on a P-type single-crystal silicon substrate cut out from a silicon ingot as the silicon ingot is sliced, in order to form the solar-power-generator substrate on the surface of which the texture is formed by removing the contaminants adhering to the surface, removing the damaged layer, and forming a texture structure. FIG. 5 is a flowchart explaining the flow of the method for manufacturing the solar-power-generator substrate according to the present embodiment.

In the present embodiment, the process of removing the damaged layer on the surface of the P-type single-crystal silicon substrate is not performed after the slicing and before the etching process for forming the texture, but organic impurities and metal impurities that are contaminants adhering to the natural oxide film covering the surface of the P-type single-crystal silicon substrate even after the cleaning after the slicing are cleaned and removed.

More specifically, a cleaning process is performed first, in which a cleaning treatment (a surface treatment) is performed on the surface of a P-type single-crystal silicon substrate cut out from a silicon ingot by slicing the silicon ingot with a cleaning fluid containing an oxidizing chemical (Step S10). This cleaning treatment, for example, is performed by immersing the P-type single-crystal silicon substrate in the cleaning fluid containing an oxidizing chemical. In this cleaning process, organic impurities and metal impurities that are contaminants adhering to the natural oxide film covering the surface of the P-type single-crystal silicon substrate are removed. A hydrogen peroxide solution, ozone water, or the like is used as the cleaning fluid containing an oxidizing chemical. The P-type single-crystal silicon substrate is not necessarily immersed in the cleaning fluid containing an oxidizing chemical. It is satisfactory if the cleaning fluid containing an oxidizing chemical can be supplied to the surface of the P-type single-crystal silicon substrate and the surface of the P-type single-crystal silicon substrate can be cleaned. The same is true for other treatments.

Subsequently, a washing process is performed subsequent to Step S10. The washing process washes away and removes the cleaning fluid containing an oxidizing chemical adhering to the P-type single-crystal silicon substrate in the cleaning treatment at Step S10, with water (Step S20). The cleaning fluid containing an oxidizing chemical may be washed away and removed with a neutralizing agent. An alkaline aqueous solution containing sodium hydroxide, potassium hydroxide, or the like is used as the neutralizing agent, for example.

Subsequently, a wet-etching process (a surface treatment) is performed subsequent to Step S20. In the wet-etching process, the P-type single-crystal silicon substrate is immersed in an alkaline aqueous solution that is an etchant so as to form the texture on the surface of the P-type single-crystal silicon substrate (Step S30). A high-temperature chemical solution that is obtained by adding, as an additive, organic matter such as IPA to an alkaline aqueous solution containing sodium hydroxide or potassium hydroxide is used as the etchant, for example.

By anisotropic etching of the surface of the P-type single-crystal silicon substrate using such an etchant, the texture structure is formed on the surface of the P-type single-crystal silicon substrate. The texture structure is formed by asperities having convex portions in the form of quadrangular pyramids each surrounded by silicon (111) surfaces. In this process, the texture is formed on the surface of the P-type single-crystal silicon substrate and the damaged layer on the surface of the P-type single-crystal silicon substrate is also removed. In this manner, the solar-power-generator substrate is formed with the texture structure being formed on the surface of the P-type single-crystal silicon substrate uniformly and densely.

When Step S20 is omitted, Step S30 is performed subsequent to Step S10. However, it is preferable to perform Step S20 in order to maintain the cleanliness of the etchant and to form the texture within the surface of the P-type single-crystal silicon substrate normally, i.e., uniformly and densely.

In the present embodiment, because the damaged layer on the surface of the P-type single-crystal silicon substrate is not removed after the slicing and before the etching process for forming the texture, as described above, the silicon active surface is not exposed on the surface of the P-type single-crystal silicon substrate. Further, the texture is formed subsequent to the cleaning of the P-type single-crystal silicon substrate with the cleaning fluid containing an oxidizing chemical without exposing the surface of the P-type single-crystal silicon substrate to the air for a long time; therefore, it is possible to prevent contaminants (organic impurities and metal impurities) that are contained in the air and cause a failure to form the texture, from adsorbing onto the surface of the P-type single-crystal silicon substrate.

That is, because contaminants (organic impurities and metal impurities) adhering to the oxide film on the surface of the P-type single-crystal silicon substrate are removed without exposing the silicon active surface on the surface of the P-type single-crystal silicon substrate, etching is not hindered by the contaminants (organic impurities and metal impurities). Therefore, a failure to form the texture caused by contaminants (organic impurities and metal impurities) adhering to the surface of the P-type single-crystal silicon substrate can be prevented, and the texture can be reliably formed on the surface of the P-type single-crystal silicon substrate uniformly and densely.

After the etching treatment, the alkali and the additive that have been consumed in a single etching treatment are compensated for, so that the etchant is used a plurality of times. In the present embodiment, it is possible to prevent contaminants (organic impurities and metal impurities) that are contained in the air and cause a failure to form the texture from absorbing onto the surface of the P-type single-crystal silicon substrate, as described above. Therefore, it is possible to suppress the accumulation of contaminants (organic impurities and metal impurities) adhering to the surface of the P-type single-crystal silicon substrate in the etchant and to minimize degradation of the performance of the etchant. Therefore, the replacement period of the etchant can be made longer and the cost of the chemical solution can be reduced. Accordingly, it is possible to form, at low cost, a solar-power-generator substrate in which the texture structure is formed on the surface thereof uniformly and densely.

Further, in the present embodiment, the damaged layer on the surface of the P-type single-crystal silicon substrate is removed simultaneously with the formation of the texture structure on the surface of the P-type single-crystal silicon substrate, as described above. Therefore, it is possible to omit the process of removing the damaged layer that has been required separately from the process of forming the texture structure.

Figure 6:
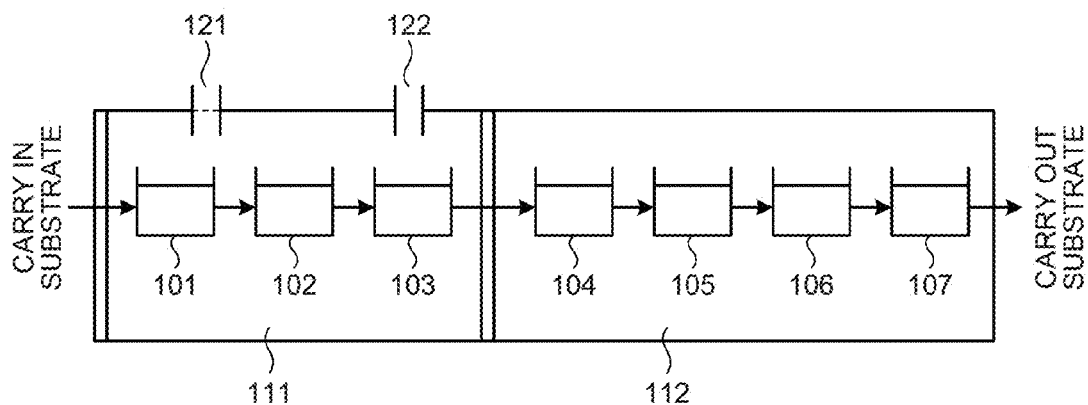
FIG. 6 is a schematic diagram illustrating a schematic configuration of the apparatus for manufacturing the solar-power-generator substrate that manufactures the solar-power-generator substrate according to the embodiment of the present invention.

The steps from the cleaning process (Step S10) to the wet-etching process (Step S30) in the method for manufacturing the solar-power-generator substrate according to the present embodiment, which are described above, can be performed by using the apparatus for manufacturing the solar-power-generator substrate illustrated in FIG. 6. FIG. 6 is a schematic diagram illustrating a schematic configuration of the apparatus for manufacturing the solar-power-generator substrate that manufactures the solar-power-generator substrate according to the present embodiment. The apparatus for manufacturing the solar-power-generator substrate illustrated in FIG. 6 is a device that can form the texture without exposing, to the air, the silicon surface from which contaminants (organic impurities and metal impurities) are removed by immersing the P-type single-crystal silicon substrate in an oxidizing chemical.

In the apparatus for manufacturing the solar-power-generator substrate illustrated in FIG. 6, a cleaning tank 101, a washing tank 102, and a texture formation tank 103 are arranged in a first processing chamber 111, while a washing tank 104, a neutralization tank 105, a washing tank 106, and a drying tank 107 are arranged in a second processing chamber 112.

The cleaning tank 101 stores a cleaning fluid containing an oxidizing chemical for cleaning and removing organic impurities and metal impurities that are contaminants adhering to the natural oxide film covering the surface of a P-type single-crystal silicon substrate, and the P-type single-crystal silicon substrate is immersed in the cleaning tank 101. The washing tank 102 is arranged adjacent to the cleaning tank 101 and stores water or a neutralizing agent for washing away the cleaning fluid containing an oxidizing chemical that adheres to the P-type single-crystal silicon substrate pulled up from the cleaning tank 101, and the P-type single-crystal silicon substrate is immersed in the washing tank 102.

The texture formation tank 103 is arranged adjacent to the washing tank 102 and stores an alkaline aqueous solution for performing anisotropic etching on the surface of the P-type single-crystal silicon substrate pulled up from the washing tank 102 to form a texture structure, and the P-type single-crystal silicon substrate is immersed in the texture formation tank 103. A high-temperature chemical solution that is obtained by adding, as an additive, organic matter such as IPA to an alkaline aqueous solution containing sodium hydroxide or potassium hydroxide is used as the alkaline aqueous solution, for example.

The washing tank 104, arranged at a position adjacent to the texture formation tank 103 in the second processing chamber 112, stores water for washing away the alkaline aqueous solution adhering to the P-type single-crystal silicon substrate pulled up from the texture formation tank 103, and the P-type single-crystal silicon substrate is immersed in the washing tank 104. The neutralization tank 105, arranged at a position adjacent to the washing tank 104, stores a neutralizing agent for neutralizing the alkaline aqueous solution adhering to the P-type single-crystal silicon substrate pulled up from the washing tank 104, and the P-type single-crystal silicon substrate is immersed in the neutralization tank 105.

The washing tank 106, arranged at a position adjacent to the neutralization tank 105, stores water for washing away the neutralizing agent adhering to the P-type single-crystal silicon substrate pulled up from the neutralization tank 105, and the P-type single-crystal silicon substrate is immersed in the washing tank 106. The drying tank 107, arranged at a position adjacent to the washing tank 106, dries the wet P-type single-crystal silicon substrate pulled up from the washing tank 106.

This apparatus for manufacturing the solar-power-generator substrate is provided with one or more of each of the tanks described above, and all the tanks may have a system for circulating the fluid. Water such as ion exchanged water is used, for example, as a solvent for the chemical solution stored in the cleaning tank 101 to the washing tank 106. Further, the substrate is transported by a substrate transportation unit (not illustrated) in this apparatus for manufacturing the solar-power-generator substrate, for example.

A place where this apparatus for manufacturing the solar-power-generator substrate is installed preferably has a clean room environment.

In a case in which the place where this apparatus for manufacturing the solar-power-generator substrate is installed does not have a clean room environment, to achieve the above effects of the cleaning process and the etching process for the P-type single-crystal silicon substrate according to the present embodiment, it is preferable that the atmosphere only in the region in the apparatus for manufacturing the solar-power-generator substrate, in which the substrate cleaning process using the oxidizing chemical solution to the etching process for forming the texture are performed, can be maintained at the same degree of cleanliness as that of a clean room environment (for example, about class 10000). Therefore, with this apparatus for manufacturing the solar-power-generator substrate, at least the first processing chamber 111, which is a region that includes the cleaning tank 101, the washing tank 102, and the texture formation tank 103, is isolated from the second processing chamber 112, which is a region that includes the washing tank 104, the neutralization tank 105, the washing tank 106, and the drying tank 107.

The atmosphere in the first processing chamber 111 isolated from the second processing chamber 112 is set so as to have the same degree of cleanliness as that of a clean room environment from which organic impurities and metal impurities that are contaminants are removed. The structure is such that the atmosphere (air) that is cleaned by passing through a chemical filter (an air filter) or the like for removing organic impurities and metal impurities that are contaminants is supplied to the first processing chamber 111. That is, an atmosphere gas is supplied to the first processing chamber 111 from an apparatus-atmosphere supply port 121 having a function of removing contaminants. The atmosphere gas in the first processing chamber 111 is exhausted from an apparatus-atmosphere exhaust port 122. Further, the atmosphere supplied to the isolated first processing chamber 111 may be an inert gas having the same degree of cleanliness as that of a clean room environment from which organic impurities and metal impurities that are contaminants are removed.

As long as the atmosphere in the first processing chamber 111 as described above is an atmosphere in which the content rate of organic impurities and metal impurities that are contaminants is lower than that of the air, it is possible to suppress adhesion of organic impurities and metal impurities that are contaminants in the atmosphere to the surface of the P-type single-crystal silicon substrate after being cleaned. However, the use of the atmosphere as described above is preferable for forming the texture structure over the entire region within the surface of the P-type single-crystal silicon substrate uniformly and densely.

With this apparatus for manufacturing the solar-power-generator substrate, a P-type single-crystal silicon substrate that has been sliced from an ingot and from which a damaged layer on its surface has not been removed after the slicing is first immersed in the cleaning tank 101. Organic impurities and metal impurities that are contaminants adhering to the natural oxide film covering the surface of the P-type single-crystal silicon substrate are removed by immersing the P-type single-crystal silicon substrate in the cleaning tank 101 storing the cleaning fluid containing an oxidizing chemical, so that the surface is cleaned.

After a predetermined time has elapsed, the P-type single-crystal silicon substrate is pulled up from the cleaning tank 101 and is subsequently immersed in the washing tank 102. The cleaning fluid containing an oxidizing chemical adhering to the surface of the P-type single-crystal silicon substrate is washed away by immersing the P-type single-crystal silicon substrate in the washing tank 102, which stores the water or neutralizing agent for washing away the cleaning fluid containing an oxidizing chemical.

After a predetermined time has elapsed, the P-type single-crystal silicon substrate is pulled up from the washing tank 102 and is subsequently immersed in the texture formation tank 103. The texture structure is formed on the surface by anisotropic etching by immersing the P-type single-crystal silicon substrate in the texture formation tank 103, which stores the alkaline aqueous solution for forming the texture structure on the surface of the P-type single-crystal silicon substrate.

After a predetermined time has elapsed, the P-type single-crystal silicon substrate is pulled up from the texture formation tank 103, is transported from the first processing chamber 111 to the second processing chamber 112, and is immersed in the washing tank 104. The alkaline aqueous solution adhering to the surface is washed away by immersing the P-type single-crystal silicon substrate in the washing tank 104, which stores the water for washing away the alkaline aqueous solution.

After a predetermined time has elapsed, the P-type single-crystal silicon substrate is pulled up from the washing tank 104 and is immersed in the neutralization tank 105. By immersing the P-type single-crystal silicon substrate in the neutralization tank 105, which stores a neutralizing agent for neutralizing the alkaline aqueous solution, the alkaline aqueous solution adhering to the surface is neutralized.

After a predetermined time has elapsed, the P-type single-crystal silicon substrate is pulled up from the neutralization tank 105 and is immersed in the washing tank 106. By immersing the P-type single-crystal silicon substrate in the washing tank 106, which stores water for washing away the neutralizing agent, the neutralizing agent adhering to the surface is washed away.

Subsequently, after a predetermined time has elapsed, the P-type single-crystal silicon substrate is pulled up from the washing tank 106 and is dried in the drying tank 107.

At least the treatments in the cleaning tank 101, the washing tank 102, and the texture formation tank 103 of the treatments described above are performed in succession. That is, cleaning of the P-type single-crystal silicon substrate and formation of the texture are performed in succession. In addition, the atmosphere in the first processing chamber 111 is set to have the same degree of cleanliness as that of a clean room environment from which organic impurities and metal impurities that are contaminants are removed. Therefore, the texture formation is performed subsequent to the cleaning of the P-type single-crystal silicon substrate in the cleaning tank 101 without exposing the surface of the P-type single-crystal silicon substrate to the air for a long time, so that it is possible to prevent contaminants (organic impurities and metal impurities) that are contained in the air and cause a failure to form the texture from absorbing onto the surface of the P-type single-crystal silicon substrate.

Next, the method for manufacturing the solar-power-generator substrate according to the present embodiment is described on the basis of specific examples. The following examples were carried out in accordance with the method for manufacturing the solar-power-generator substrate illustrated in FIG. 5.

Example 1

First, a P-type single-crystal silicon substrate from which a damaged layer on the surface thereof was not removed after slicing was immersed in a cleaning fluid containing an oxidizing chemical for three minutes, so that organic impurities and metal impurities that are contaminants adhering to the natural oxide film covering the surface of the P-type single-crystal silicon substrate were removed and thus the P-type single-crystal silicon substrate was cleaned (Step S10). A hydrogen peroxide solution having a temperature of 55° C. and a concentration of 0.1 vol % was used as the cleaning fluid containing an oxidizing chemical.

The P-type single-crystal silicon substrate was then pulled out from the hydrogen peroxide solution and washed with water, so that the hydrogen peroxide solution adhering to the surface of the P-type single-crystal silicon substrate was washed away (Step S20).

The P-type single-crystal silicon substrate was then immersed in an alkaline aqueous solution for 20 minutes, so that a texture structure was formed by anisotropic etching on the surface of the P-type single-crystal silicon substrate (Step S30). The texture formation employed a successive batch processing method that allows a plurality of substrates to be processed at a time, and plural batch processes were performed.

The performance of the texture was evaluated by measuring the light reflectance of the surface of the P-type single-crystal silicon substrate on which the texture was formed. The measurement result of light reflectance is an average (an averaged light reflectance) of the measured values of the light reflectance for light of a wavelength of 700 nanometers at five points on the surface of the P-type single-crystal silicon substrate.

Figure 7:
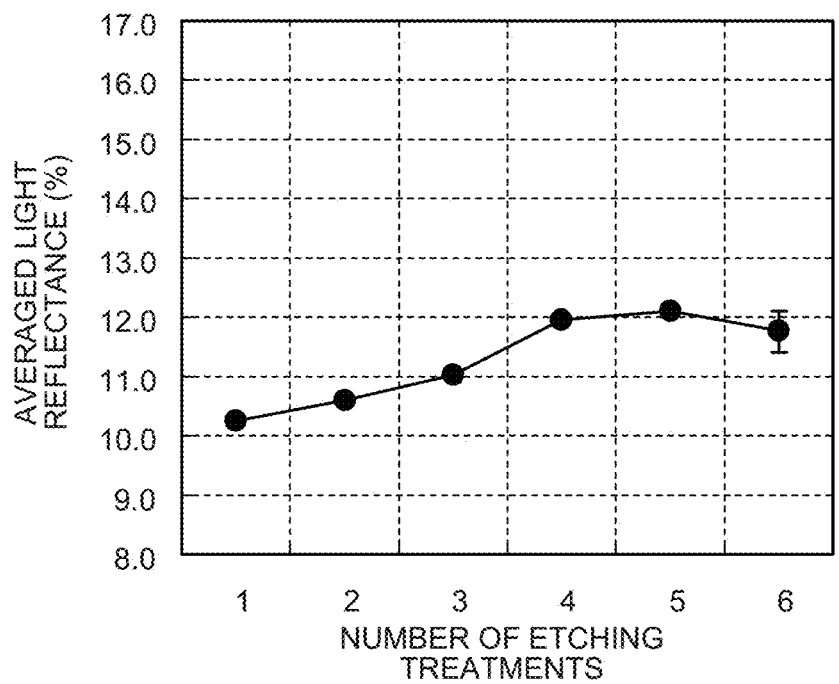
FIG. 7 is a characteristic diagram illustrating the measurement result of light reflectance when texture formation is performed on a P-type single-crystal silicon substrate cleaned with a cleaning fluid containing an oxidizing chemical.

The above experiment was performed in an atmosphere having the same degree of cleanliness as that of a clean room environment from which organic impurities and metal impurities that are contaminants were removed through a chemical filter in order to prevent organic impurities and metal impurities that are contaminants from absorbing onto the surface of the P-type single-crystal silicon substrate during transportation after the surface of the P-type single-crystal silicon substrate is cleaned with a hydrogen peroxide solution until the texture is formed. The measurement result of light reflectance in the experiment is illustrated in FIG. 7. FIG. 7 is a characteristic diagram illustrating the measurement result of light reflectance when texture formation is performed on a P-type single-crystal silicon substrate cleaned with a cleaning fluid containing an oxidizing chemical. In FIG. 7, the horizontal axis represents the number of etching treatments (the number of batches) in which the texture formation was performed on the P-type single-crystal silicon substrate by using the same etchant, and the vertical axis represents averaged light reflectance (%).

In FIG. 7, the reflectance of the P-type single-crystal silicon substrate in the first batch is 10.3%. The light reflectance gradually increases as the number of batches increases. The light reflectance of the P-type single-crystal silicon substrate in the sixth batch is 11.8%, which is a satisfactory result at a practical level. When an experiment was performed in the same manner as the above except that normal atmosphere without passing through the chemical filter was used as the processing atmosphere, the light reflectance of the P-type single-crystal silicon substrate in the first batch to the sixth batch is about 10.0% to about 13.0%, which is a satisfactory result at a practical level. However, because the obtained light reflectance is much lower when the process is performed with the atmosphere that has passed through the chemical filter, it is preferable to perform the process with the atmosphere that has passed through the chemical filter.

Example 2

Figure 8:
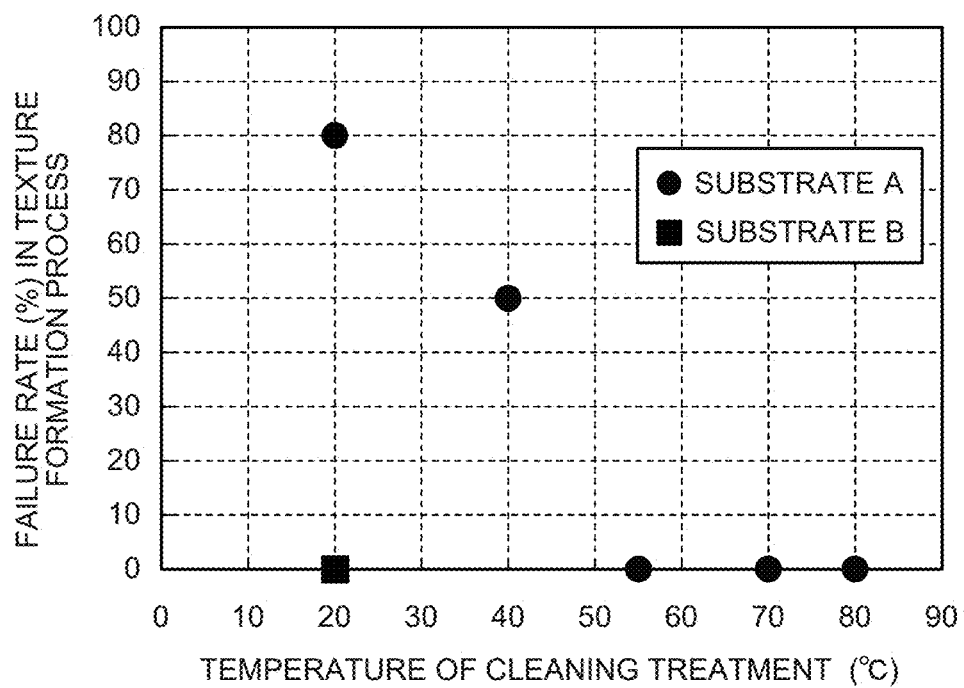
FIG. 8 is a characteristic diagram illustrating the failure occurrence rate (%) in a texture formation process when texture formation is performed on a P-type single-crystal silicon substrate cleaned with a cleaning fluid containing an oxidizing chemical.

In substrate cleaning of a P-type single-crystal silicon substrate using a hydrogen peroxide solution, the concentration of the hydrogen peroxide solution, the cleaning temperature, the cleaning time, and the like have an effect on the effectiveness of the cleaning. Therefore, first, to investigate the effect of the cleaning temperature on the cleaning capacity when the concentration of the hydrogen peroxide solution is 0.1 vol %, the substrate cleaning was performed on a P-type single-crystal silicon substrate (a substrate A) having a specific manufacturing history by using hydrogen peroxide solutions at five temperature: 20° C., 40° C., 55° C., 70° C., and 80° C. Thereafter, the textures were formed and the performances of the textures were compared. The experiment was performed in the same manner as that in Example 1, except that the temperature of the hydrogen peroxide solution was changed. The result is illustrated in FIG. 8. FIG. 8 is a characteristic diagram illustrating the failure occurrence rate (%) in a texture formation process when texture formation is performed on a P-type single-crystal silicon substrate cleaned with a cleaning fluid containing an oxidizing chemical. In FIG. 8, the horizontal axis represents the temperature of the cleaning treatment of the P-type single-crystal silicon substrate (the temperature of the hydrogen peroxide solution) (° C.), and the vertical axis represents the failure rate (%) in the texture formation process.

The failure rate in the texture formation process illustrated in FIG. 8 is the ratio of P-type single-crystal silicon substrates including a region where the texture is not normally formed as illustrated in FIG. 4 to the number of substrates subjected to the texture formation treatment, and can be used as an index representing the performance of the texture formation. As a result of this experiment, the failure rate was 80% when the cleaning temperature was 20° C., whereas the failure rate was reduced to 50% when the cleaning temperature was 40° C. Further, it was found that the texture was normally formed over the entire region of the substrate surface when the cleaning temperature was 55° C. or higher.

Figure 9:
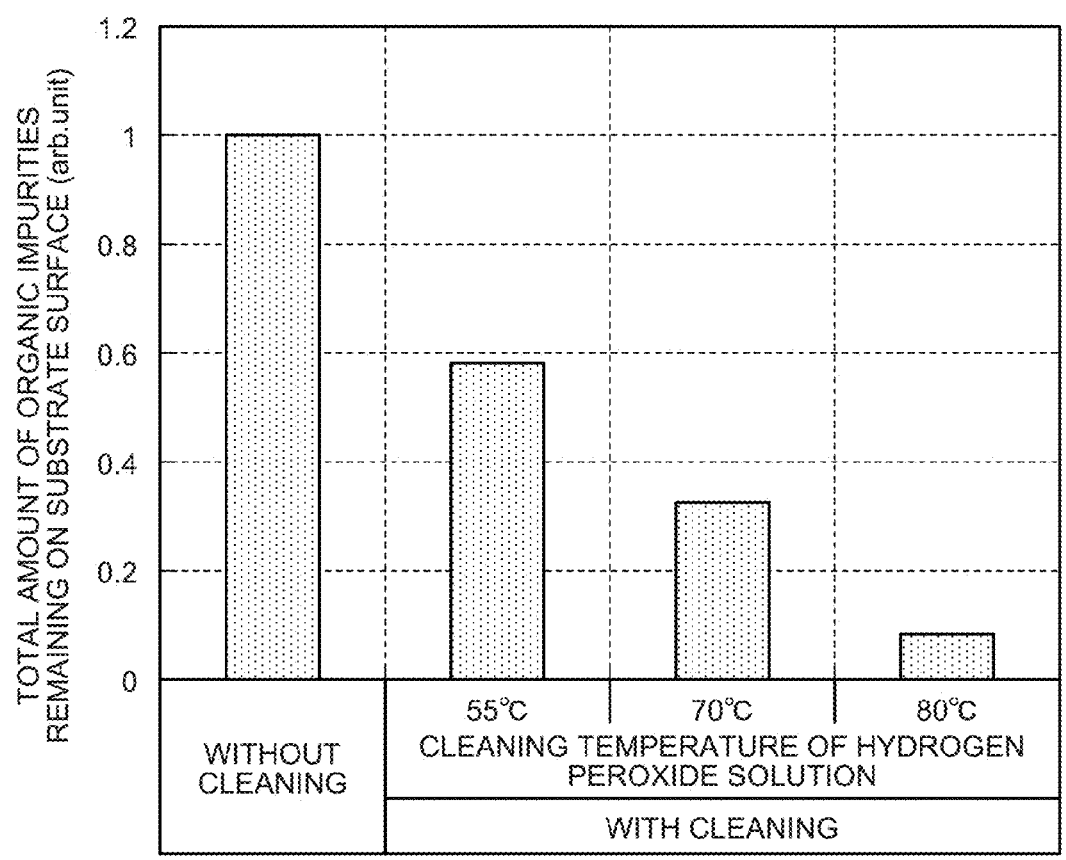
FIG. 9 is a characteristic diagram illustrating the total amount of organic impurities remaining on the surface of a P-type single-crystal silicon substrate after substrate cleaning using a cleaning fluid containing an oxidizing chemical at a cleaning temperature.

In addition, the amount of organic impurities adhering to the substrate surface was examined before and after the cleaning of the P-type single-crystal silicon substrate using a hydrogen peroxide solution. FIG. 9 illustrates the result of the examination. FIG. 9 is a characteristic diagram illustrating the total amount of organic impurities remaining on the surface of a P-type single-crystal silicon substrate after substrate cleaning using a cleaning fluid containing an oxidizing chemical at a cleaning temperature. In FIG. 9, the horizontal axis represents the cleaning temperature (a cleaning temperature of a hydrogen peroxide solution), and the vertical axis represents the total amount of organic impurities that are impurities on the substrate surface (arb. unit). Further, the total amount of organic impurities is represented as a ratio of the total amount of organic impurities after the substrate cleaning, when standardization is performed with the assumption that the total amount of organic impurities remaining on the surface of the P-type single-crystal silicon substrate before the substrate cleaning (not cleaned) is a reference (=1).

It is understood from FIG. 9 that the total amount of organic impurities is reduced as the cleaning temperature is increased. Further, the results illustrated in FIGS. 8 and 9 indicate that, when the total amount of organic impurities is reduced to 60% of that before the substrate cleaning, a failure to form the texture is eliminated.

Organic impurities and metal impurities adhering to the surfaces of the substrates provided by various substrate processing makers are different for the different substrate processing makers. Therefore, the cleaning temperature had to be raised to 55° C. for a specific substrate A for which the cleaning using the hydrogen peroxide solution was evaluated in this experiment. However, an experiment was performed on a P-type single-crystal silicon substrate (a substrate B) having a different specific manufacturing history in the same manner as the above at a cleaning temperature of 20° C. The result is also illustrated in FIG. 8. This result indicates that the cleaning effect of suppressing a failure to form the texture appeared even at a cleaning temperature of 20° C. in the case of the substrate B. Therefore, it is preferable that the cleaning temperature is 20° C. or higher in the substrate cleaning of the P-type single-crystal silicon substrate using the hydrogen peroxide solution. Further, an upper limit of the cleaning temperature in the substrate cleaning of the P-type single-crystal silicon substrate using the hydrogen peroxide solution is 100° C., from a viewpoint of the vaporization rate of hydrogen peroxide.

Example 3

Next, the effect of the concentration of the hydrogen peroxide solution on the substrate cleaning capacity was investigated in substrate cleaning of a P-type single-crystal silicon substrate using the hydrogen peroxide solution. The substrate cleaning was performed on a P-type single-crystal silicon substrate having a specific manufacturing history, using hydrogen peroxide solutions with ten different concentrations: 0.001 vol %, 0.005 vol %, 0.01 vol %, 0.025 vol %, 0.05 vol %, 0.1 vol %, 0.2 vol %, 0.5 vol %, 1.0 vol %, and 2.0 vol %, in order to investigate the effect of the concentration of the hydrogen peroxide solution on the cleaning capacity. Thereafter, the textures were formed and the performances of the textures were compared. The experiment was performed in the same manner as that in Example 1, except that the concentration of the hydrogen peroxide solution was changed. The substrate cleaning was performed at a temperature of 55° C. for 3 minutes. The results are shown in Table 1.

TABLE 1

| | Cleaning treatment temperature 55° C. Concentration of hydrogen peroxide solution (vol %) | | | | | | | | | |
|---|---|---|---|---|---|---|---|---|---|---|
| | 0.001 | 0.005 | 0.01 | 0.025 | 0.05 | 0.1 | 0.2 | 0.5 | 1.0 | 2.0 |
| Performance evaluation of texture | X | Δ | ○ | ○ | ○ | ○ | ○ | ○ | ○ | ○ |

For indexes of the performance evaluation of the texture in Table 1, the circle represents that the texture was formed satisfactorily over the entire region of the substrate surface, the triangle represents that the texture was not formed in a portion on the substrate surface, and the cross represents that the texture was not formed over the entire region of the substrate surface.

As a result of the experiment, when the concentration of the hydrogen peroxide solution was 0.001 vol %, almost no effect on the substrate cleaning was apparent. When the concentration of the hydrogen peroxide solution was 0.005 vol %, the effect on the substrate cleaning started to appear and the performance of the texture was satisfactory except for the portion on the substrate surface in which the texture was not formed. Further, when the concentration of the hydrogen peroxide solution was 0.01 vol % or higher, the texture was formed satisfactorily over the entire region of the substrate surface. In addition, even when the concentration of the hydrogen peroxide solution was set higher than 0.1 vol %, the substrate cleaning effect was saturated and did not provide further improvement, and it is believed that the reaction control occurs in the cleaning with the hydrogen peroxide solution.

When an experiment was performed on a P-type single-crystal silicon substrate having a different specific manufacturing history under the same conditions, an effect having the same tendency as that of the above was obtained.

Therefore, it is preferable that the concentration of the hydrogen peroxide solution is 0.01 vol % to 0.1 vol % in the substrate cleaning of the P-type single-crystal silicon substrate using the hydrogen peroxide solution as the cleaning fluid containing an oxidizing chemical.

As described above, because the texture formation is performed subsequent to the substrate cleaning of the P-type single-crystal silicon substrate using the cleaning fluid containing an oxidizing chemical without exposing the surface of the P-type single-crystal silicon substrate to the air for a long time in the present embodiment, it is possible to prevent contaminants (organic impurities and metal impurities) contained in the air and causing a failure to form the texture from absorbing onto the surface of the P-type single-crystal silicon substrate.

That is, the damaged layer on the surface of the P-type single-crystal silicon substrate is not removed after the slicing before the etching process for forming the texture in the present embodiment. Therefore, it is possible to remove contaminants (organic impurities and metal impurities) adhering to the oxidation film on the surface of the P-type single-crystal silicon substrate without exposing the silicon active surface on the surface of the P-type single-crystal silicon substrate, and etching is not hindered by the contaminants (organic impurities and metal impurities). Thus, a failure to form the texture caused by contaminants (organic impurities and metal impurities) adhering to the surface of the P-type single-crystal silicon substrate can be prevented, and the texture can be reliably formed on the surface of the P-type single-crystal silicon substrate uniformly and densely.

Furthermore, the atmosphere in which the P-type single-crystal silicon substrate is transported after the substrate cleaning is set to be a clean atmosphere from which organic impurities and metal impurities are removed in the present embodiment, so that the texture formation is successively performed while the substrate surface is prevented from being exposed to the air during transportation of the P-type single-crystal silicon substrate. Therefore, it is possible to maintain the cleanliness of the substrate surface from the start of the texture formation at a satisfactory level. In this manner, while a failure to form the texture caused by contaminants (organic impurities and metal impurities) adhering to the surface of the P-type single-crystal silicon substrate is prevented, the texture can be more reliably formed on the surface of the P-type single-crystal silicon substrate uniformly and densely.

Further, in the present embodiment, it is possible to prevent contaminants (organic impurities and metal impurities) that are contained in the air and cause a failure to form the texture from absorbing onto the surface of the P-type single-crystal silicon substrate, as described above. Therefore, it is possible to suppress the accumulation of contaminants (organic impurities and metal impurities) adhering to the surface of the P-type single-crystal silicon substrate in the etchant and to minimize degradation of the performance of the etchant. Therefore, the replacement period of the etchant can be made longer and the cost of the chemical solution can be reduced. Accordingly, it is possible to form, at low cost, a solar-power-generator substrate in which the texture structure is formed on the surface thereof uniformly and densely.

Therefore, according to the present embodiment, it is possible to reliably form, at low cost, a texture structure with an uneven structure that includes convex portions in the form of quadrangular pyramids each surrounded by silicon (111) surfaces, has a low light reflectance on the surface substrate, and is uniform over the substrate surface, uniformly and densely. Therefore, according to the present embodiment, the solar-power-generator substrate having an excellent optical confinement effect can be obtained reliably at low cost. It is also possible to reliably obtain, at low cost, a high-quality solar power generator having an excellent power-generation property by using this solar-power-generator substrate.

INDUSTRIAL APPLICABILITY

As described above, the method for manufacturing a solar-power-generator substrate according to the present invention is useful when a texture structure having a low light reflectance is reliably formed at low cost on the surface of a silicon substrate.

REFERENCE SIGNS LIST 11 single-crystal silicon substrate, 11a N-type impurity diffusion layer, 12 anti-reflective film, 13 light-receiving-surface side electrode, 13a grid electrode, 13b bus electrode, 14 back-surface electrode, 101 cleaning tank, 102 washing tank, 103 texture formation tank, 104 washing tank, 105 neutralization tank, 106 washing tank, 107 drying tank, 111 first processing chamber, 112 second processing chamber, 121 apparatus-atmosphere supply port, 122 apparatus-atmosphere exhaust port.

The invention claimed is:

1. A method for manufacturing a solar-power-generator substrate by cutting out a semiconductor substrate by slicing a semiconductor ingot and then by forming a texture structure on a surface of the semiconductor substrate by performing a surface treatment on the surface of the semiconductor substrate, the method comprising:
   cleaning including cleaning and removing an organic impurity and a metal impurity adhering to the surface of the semiconductor substrate with a cleaning fluid containing an oxidizing chemical;
   cleaning-fluid removal including washing away the cleaning fluid containing an oxidizing chemical adhering to the semiconductor substrate; and
   etching including removing a damaged layer on a substrate surface generated by the slicing and forming the texture structure on the surface of the semiconductor substrate by performing anisotropic etching on the surface of the semiconductor substrate with an alkaline aqueous solution, the etching being performed subsequent to the cleaning wherein the cleaning, the cleaning-fluid removing, and the etching are performed in succession.

2. The method for manufacturing a solar-power-generator substrate according to claim 1, wherein the semiconductor substrate is a crystalline silicon substrate.

3. The method for manufacturing a solar-power-generator substrate according to claim 1, wherein
   the cleaning and the etching are performed in a processing chamber with a cleaned atmosphere that is isolated from an atmosphere of an external environment and in which a content rate of the organic impurity and the metal impurity is lower than in the atmosphere of an external environment, a cleaning unit that stores the cleaning fluid and performs the cleaning and an etching unit that stores the alkaline aqueous solution and performs the etching being arranged in the processing chamber, and
   a gas with the cleaned atmosphere is supplied to the processing chamber from an apparatus-atmosphere supply port, which is arranged on an upstream side of the etching unit in the processing chamber, and a gas with an atmosphere in the processing chamber is exhausted from the processing chamber via an apparatus-atmosphere exhaust port, which is arranged above the etching unit in the processing chamber.

4. The method for manufacturing a solar-power-generator substrate according to claim 3, wherein the cleaned atmosphere is air from which the organic impurity and the metal impurity are removed through an air filter.

5. The method for manufacturing a solar-power-generator substrate according to claim 4, wherein the cleaned atmosphere is an inert atmosphere.

6. The method for manufacturing a solar-power-generator substrate according to claim 1, wherein the alkaline aqueous solution contains sodium hydroxide or potassium hydroxide.

7. The method for manufacturing a solar-power-generator substrate according to claim 1, wherein the cleaning fluid containing an oxidizing chemical is a hydrogen peroxide solution at a temperature of 20° C. or higher.

8. The method for manufacturing a solar-power-generator substrate according to claim 7, wherein the cleaning fluid containing an oxidizing chemical is a hydrogen peroxide solution having a concentration of 0.01 vol % or more and 0.1 vol % or less.

9. An apparatus for manufacturing a solar-power-generator substrate, the apparatus comprising:
a cleaning unit to perform a cleaning treatment of supplying a cleaning fluid containing an oxidizing chemical to a surface of a semiconductor substrate cut out from a semiconductor ingot by slicing the semiconductor ingot and cleaning and removing an organic impurity and a metal impurity adhering to the surface of the semiconductor substrate; and
an etching unit to remove a damaged layer on a substrate surface generated by the slicing and form a texture structure on the surface of the semiconductor substrate by performing an anisotropic etching treatment on the surface of the semiconductor substrate by supplying an alkaline aqueous solution to the surface of the semiconductor substrate from which the organic impurity and the metal impurity are cleaned and removed in the cleaning unit, wherein
a cleaning-fluid removal treatment of washing away the cleaning fluid containing an oxidizing chemical adhering to the semiconductor substrate in the cleaning treatment in the cleaning unit is performed between the cleaning treatment in the cleaning unit and the anisotropic etching treatment in the etching unit, and wherein the cleaning treatment, the cleaning-fluid removal treatment, and the anisotropic etching treatment are performed in succession.

10. The apparatus for manufacturing a solar-power-generator substrate according to claim 9, wherein
the cleaning treatment in the cleaning unit and the anisotropic etching treatment in the etching unit are performed in a processing chamber with a cleaned atmosphere that is isolated from an atmosphere of an external environment and in which a content rate of the organic impurity and the metal impurity is lower than in the atmosphere of an external environment, the cleaning unit and the etching unit being arranged in the processing chamber, and
a gas with the cleaned atmosphere is supplied to the processing chamber from an apparatus-atmosphere supply port, which is arranged on an upstream side of the etching unit in the processing chamber, and a gas with an atmosphere in the processing chamber is exhausted from the processing chamber via an apparatus-atmosphere exhaust port, which is arranged above the etching unit in the processing chamber.

11. The apparatus for manufacturing a solar-power-generator substrate according to claim 10, wherein the cleaned atmosphere is air from which the organic impurity and the metal impurity are removed through an air filter.

12. The apparatus for manufacturing a solar-power-generator substrate according to claim 10, wherein the cleaned atmosphere is an inert atmosphere.

* * * * *